(12) United States Patent
Butti et al.

(10) Patent No.: US 11,018,494 B2
(45) Date of Patent: May 25, 2021

(54) ELECTRONIC PROTECTION DEVICE

(71) Applicant: ABB Schweiz AG, Baden (CH)

(72) Inventors: Agostino Butti, Vittuone (IT); Antonio Currá, Abbiategrasso (IT); Vittorio Cozzi, Vittuone (IT)

(73) Assignee: ABB Schweiz AG, Baden (CH)

( * ) Notice: Subject to any disclaimer, the term of this patent is extended or adjusted under 35 U.S.C. 154(b) by 505 days.

(21) Appl. No.: 15/945,345

(22) Filed: Apr. 4, 2018

(65) Prior Publication Data
US 2018/0287368 A1    Oct. 4, 2018

(30) Foreign Application Priority Data

Apr. 4, 2017 (EP) ..................... 17164776

(51) Int. Cl.
| H02H 3/28 | (2006.01) |
| H02H 1/00 | (2006.01) |
| H02H 3/08 | (2006.01) |
| H02H 3/16 | (2006.01) |
| H02H 3/10 | (2006.01) |
| H02H 3/20 | (2006.01) |
| H03K 21/08 | (2006.01) |
| G01R 31/12 | (2020.01) |

(52) U.S. Cl.
CPC .......... *H02H 3/28* (2013.01); *G01R 31/1272* (2013.01); *H02H 1/0015* (2013.01); *H02H 1/0092* (2013.01); *H02H 3/08* (2013.01); *H03K 21/08* (2013.01); *H02H 3/10* (2013.01); *H02H 3/162* (2013.01); *H02H 3/20* (2013.01)

(58) Field of Classification Search
CPC .......... H02H 3/28; H02H 3/08; H02H 1/0092; H02H 1/0015; H02H 3/162; H02H 3/10; H02H 3/20; H02H 7/262; H02H 7/263; G01R 31/1272; H03K 21/08
USPC ........................................... 361/87
See application file for complete search history.

(56) References Cited

U.S. PATENT DOCUMENTS

| 5,729,145 | A | 3/1998 | Blades | |
| 7,864,492 | B2 | 1/2011 | Restrepo et al. | |
| 9,797,941 | B2 * | 10/2017 | Kolker | G01R 31/008 |
| 2007/0252603 | A1 * | 11/2007 | Restrepo | H02H 1/0015 324/536 |

(Continued)

FOREIGN PATENT DOCUMENTS

| EP | 1646119 A2 | 4/2006 |
| EP | 1646119 A3 | 11/2016 |

OTHER PUBLICATIONS

European Patent Office, Extended Search Report issued in corresponding Application No. 17164776.1, dated Jan. 11, 2018, 10 pp.

*Primary Examiner* — Dharti H Patel
(74) *Attorney, Agent, or Firm* — Taft Stettinius & Hollister LLP

(57) ABSTRACT

An electronic protection device for a LV electric line including one or more conductors, comprising: one or more pairs of electric contacts adapted to be electrically connected with corresponding conductors of the electric line, the electric contacts being operatively coupleable or decoupleable from one another; and a control unit adapted to control the operation of the electronic protection device; wherein the control unit includes an electronic arrangement to detect and determine arc fault conditions in the electric line.

20 Claims, 14 Drawing Sheets

(56) References Cited

U.S. PATENT DOCUMENTS

Figure 1:
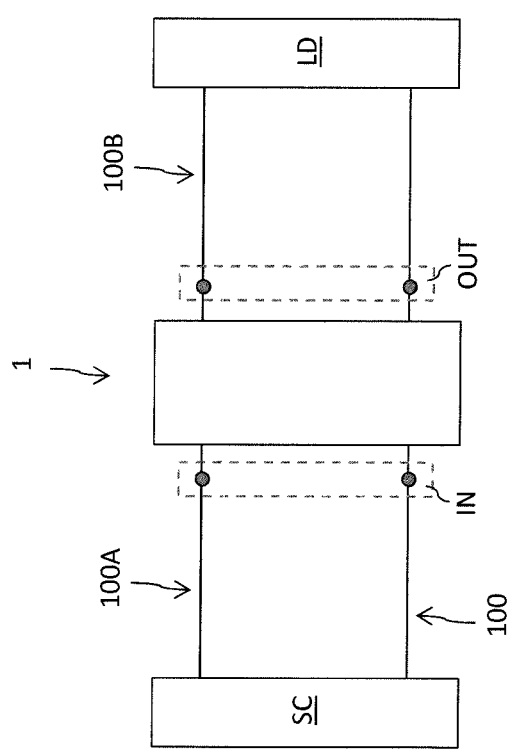

2008/0106832 A1* 5/2008 Restrepo ............ H02H 1/0015
361/42
2016/0187410 A1 6/2016 Kolker et al.

* cited by examiner

ELECTRONIC PROTECTION DEVICE

The present invention relates to an electronic protection device for low voltage (LV) electric lines.

As is known, an electronic protection device for a LV electric line generally consists in a circuit breaker equipped with an electronic control unit typically including at least a microcontroller.

An electronic protection device is normally operatively associated with the conductors of an electric line to interrupt the line current flowing along this latter in case of fault conditions.

Typical fault conditions include, for example, ground fault conditions, over-voltage conditions, over-current conditions, arc fault conditions and the like.

Among the above-mentioned possible fault conditions of the electric line, arc fault conditions are of relevant practical interest.

As is known, arcing phenomena occur quite often in an electric line as they are mainly due to the formation of a ionized gas currents between two conductive elements of the electric line at different voltage potentials, e.g. two electric contacts, two conductors, a conductor and the ground, etc.

In most cases (e.g. when generated in domestic switches or in DC motors with brushes in domestic appliances), arcing phenomena are substantially innocuous and do not require the intervention of the electronic protection device to interrupt the electric line.

However, when they are particularly frequent, long-lasting and intense (e.g. as they are due to faults in the electric lines caused by ageing, poor contacts, mechanical damages of wires, etc.), these phenomena may be quite dangerous as they may rapidly lead to fire or burning events in the electric line with consequent relevant issues in terms of safety.

In these cases, the electronic protection device is required to promptly intervene to interrupt the electric line.

For the above reasons, many electronic protection devices of the state of the art are provided with detection arrangements to determine the presence of arc fault conditions along an electric line operatively associated therewith.

Some electronic protection devices of the state of the art include electronic arrangements configured to analyze the amplitude of broadband noise propagating along the electric line and determine the presence of arc fault conditions on the base of this analysis.

Currently available solutions of this type are generally easy and cheap to produce at industrial level.

However, often, these solutions offer poor detection performances due to an excessive sensitivity to noise affecting the electric line (e.g. noise generated by household electrical appliances) as noise is sensed at relatively low frequencies (e.g. below 100 kHz).

Other electronic protection devices of the state of the art, such as the one described in US729145B1, include electronic arrangements configured to perform a more refined analysis of the spectral content of broadband noise propagating along the electric line and determine the presence of arc fault conditions on the base of this analysis.

In general, currently available solutions of this type have proven to be quite reliable and efficient in detecting arc fault conditions.

However, for the time being, these solutions are quite expensive to produce at industrial level, e.g. due to the use of expensive electronic components, such as log amplifiers.

In the state of the art, it is thus still quite felt the need for innovative electronic protection devices capable of reliable arc fault detection performances and relatively easy and inexpensive to produce at industrial level.

In order to respond to this need, the present invention provides an electronic protection device according to the following claim 1 and the related dependent claims.

In a general definition, the electronic protection device, according to the invention, comprises:
one or more pairs of electric contacts adapted to be electrically connected with corresponding conductors of the electric line, said electric contacts being operatively coupleable or decoupleable one from another;
a control unit adapted to control the operation of the electronic protection device;
a tripping unit and an operating mechanism, said tripping unit actuating said operating mechanism in response to a trip signal received from the control unit, said operating mechanism mechanically interacting with said electric contacts to decouple said electric contacts when it is actuated by the tripping unit.

The control unit of the electronic protection device of the invention comprises:
a first detection module adapted to detect the line current flowing along the electric line and provide a first detection signal indicative of the behavior of low-frequency components of said line current;
a second detection module adapted to detect the line current flowing along the electric line and provide a second detection signal indicative of the behavior of high-frequency components of said line current;
a comparison module adapted to process said second detection signal and provide a logic signal, the behavior of said logic signal depending on the behavior of said second detection signal;
a third detection module adapted to process said logic signal and provide a third detection signal indicative of the presence of possible level transitions in said logic signal;
a determination module adapted to process said first and third detection signals and determine the presence of arc fault conditions in the electric line based on said first and third detection signals, said determination module providing a trip signal for said tripping unit if arc fault conditions are determined.

Preferably, the first detection module comprises:
a first current sensing stage comprising a first current sensing device operatively coupled to a conductor of said electric line to detect said line current, said first current sensing stage being adapted to provide a first preliminary detection signal indicative of the behavior of said line current;
a first processing stage electrically connected in cascade with said first current sensing stage and adapted to process said first preliminary detection signal and provide said first detection signal.

Preferably, the first processing stage comprises:
a rectifier electrically connected in cascade with said first current sensing stage, said rectifier being adapted to rectify said first preliminary detection signal and provide a second preliminary detection signal indicative of the behaviour of said line current;
a first amplifier electrically connected in cascade with said rectifier, said first amplifier being adapted to amplify said second preliminary detection signal and provide a third preliminary detection signal indicative of the behavior of said line current;
a first filter electrically connected in cascade with said first amplifier, said first filter being adapted to filter said third preliminary detection signal and provide a fourth preliminary detection signal indicative of the behavior of low-frequency components of said line current;

a converter electrically connected in cascade with said first filter, said converter being adapted to perform an A/D conversion of said fourth preliminary detection signal and provide said first detection signal.

Preferably, the second detection module comprises:

a second current sensing stage comprising a second current sensor operatively coupled to a conductor of said electric line to detect said line current, said second current sensing stage being adapted to provide a fifth preliminary detection signal indicative of the behaviour of high-frequency components of said line current;

a second processing stage electrically connected in cascade with said second current sensing stage and adapted to process said fifth preliminary detection signal and provide said second detection signal.

Preferably, the processing stage comprises:

a second amplifier electrically connected in cascade with said second current sensing stage, said second amplifier being adapted to amplify said fifth preliminary detection signal and provide a sixth detection signal indicative of the behavior of high-frequency components of said line current.

a second filter electrically connected in cascade with said second amplifier, said second filter being adapted to filter said sixth preliminary detection signal (PDS6) and provide said second detection signal.

According to some embodiments of the invention, said third detection module is adapted to provide a third detection signal formed by a sequence of count values separated by a constant time intervals, each count value being indicative of a number of level transitions of said logic signal occurring within a corresponding time interval.

In this case, said third detection module may comprise:

a counter adapted to detect and count the level transitions of said logic signal;

first data processing resources adapted to acquire a count value indicative of the level transitions of said logic signal counted by said counter within said time interval and provide in output said count value.

As an alternative, said third detection module may comprise:

a first interrupt generator adapted to detect the level transitions of said logic signal and provide a first interrupt signal each time a level transition of said logic signal is detected;

second data processing resources adapted to count the first interrupt signals provided by said first interrupt generator and provide in output a count value indicative of the first interrupt signals counted within said time interval.

According to other embodiments of the invention, said third detection module is adapted to provide a third detection signal formed by a sequence of logic values separated by constant time intervals, each logic value being indicative of the presence of at least a level transition in said logic signal within a corresponding time interval.

In this case, said third detection module may comprise:

a second interrupt generator adapted to detect the level transitions of said logic signal and provide a second interrupt signal if a level transition of said logic signal is detected;

third data processing resources adapted to enable said second interrupt generator at the beginning of said time interval and disable said second interrupt generator if said second interrupt signal is received from said second interrupt generator, said third data processing resources being adapted to provide a logic value indicative of the receipt of said second interrupt signal within said time interval.

Preferably, the determination module is adapted to execute a determination procedure comprising the following steps:

for a half-period of said first detection signal, executing the following steps:

comparing said first detection signal with a first threshold value;

comparing said third detection signal with a second threshold value;

detecting a first number of consecutive count values or logic values higher or equal than said second threshold value for said third detection signal;

detecting a second number of consecutive count values or logic values lower than said second threshold value for said third detection signal;

checking whether a first condition occurs, in which a first number of consecutive count values or logic values higher than a third threshold value is detected;

checking whether a second condition occurs, in which a second number of consecutive count values or logic values higher than a fourth threshold value is detected during a time window of said half-period, in which said first detection signal is lower than said first threshold value;

detecting a third number of half-periods of said first detection signal for which said first and second conditions simultaneously occur;

providing in output said trip signal if said third number of half-periods is higher than a fifth threshold value.

Figure 2:
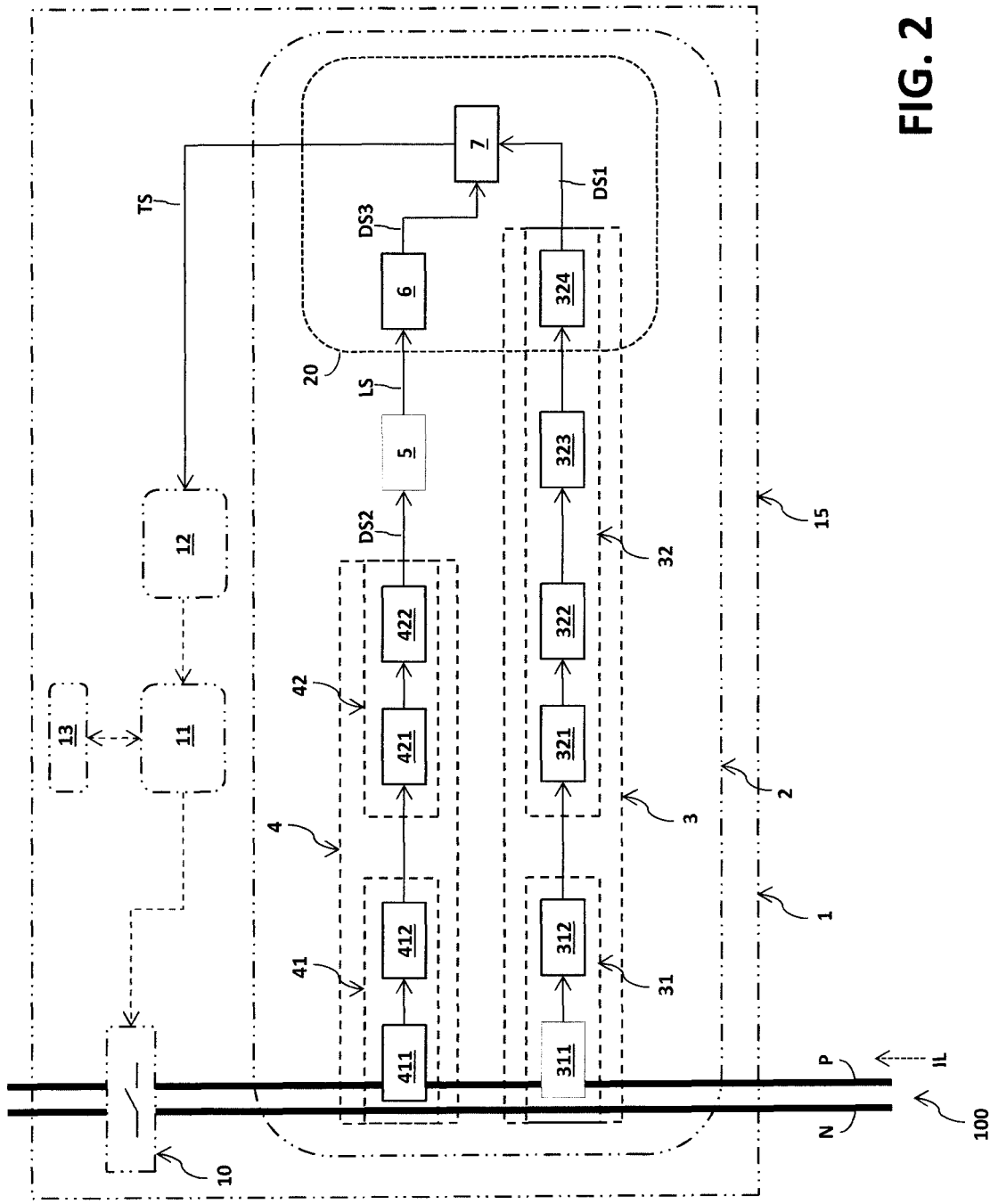
Figure 3:
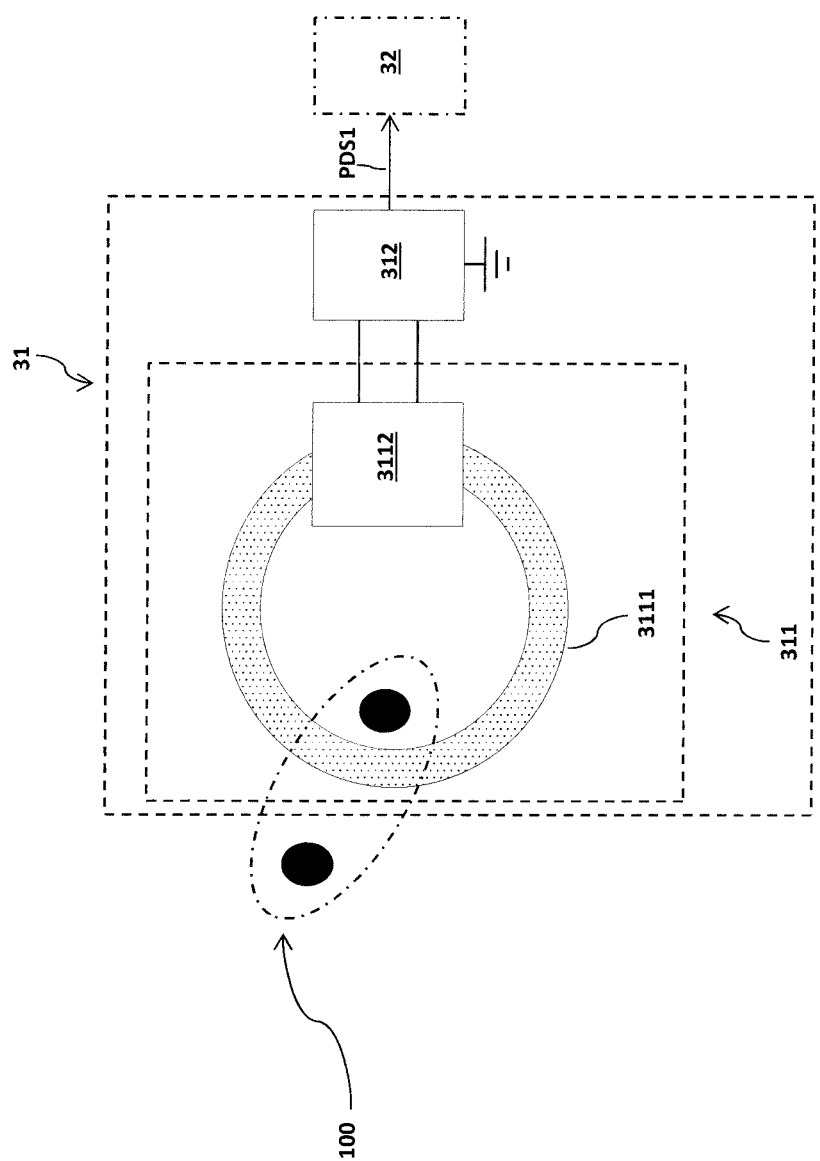
Figure 4:
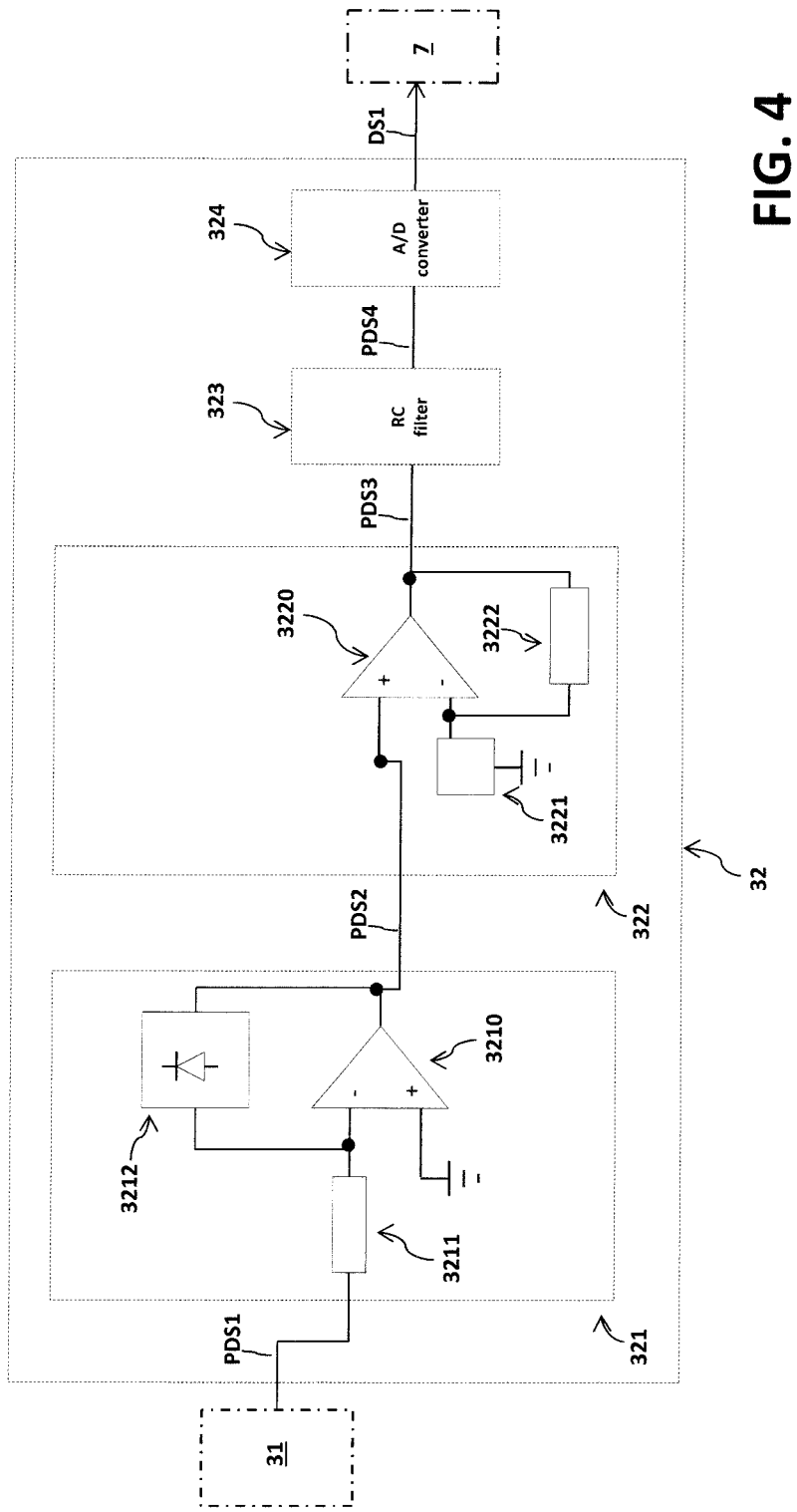
Figure 5:
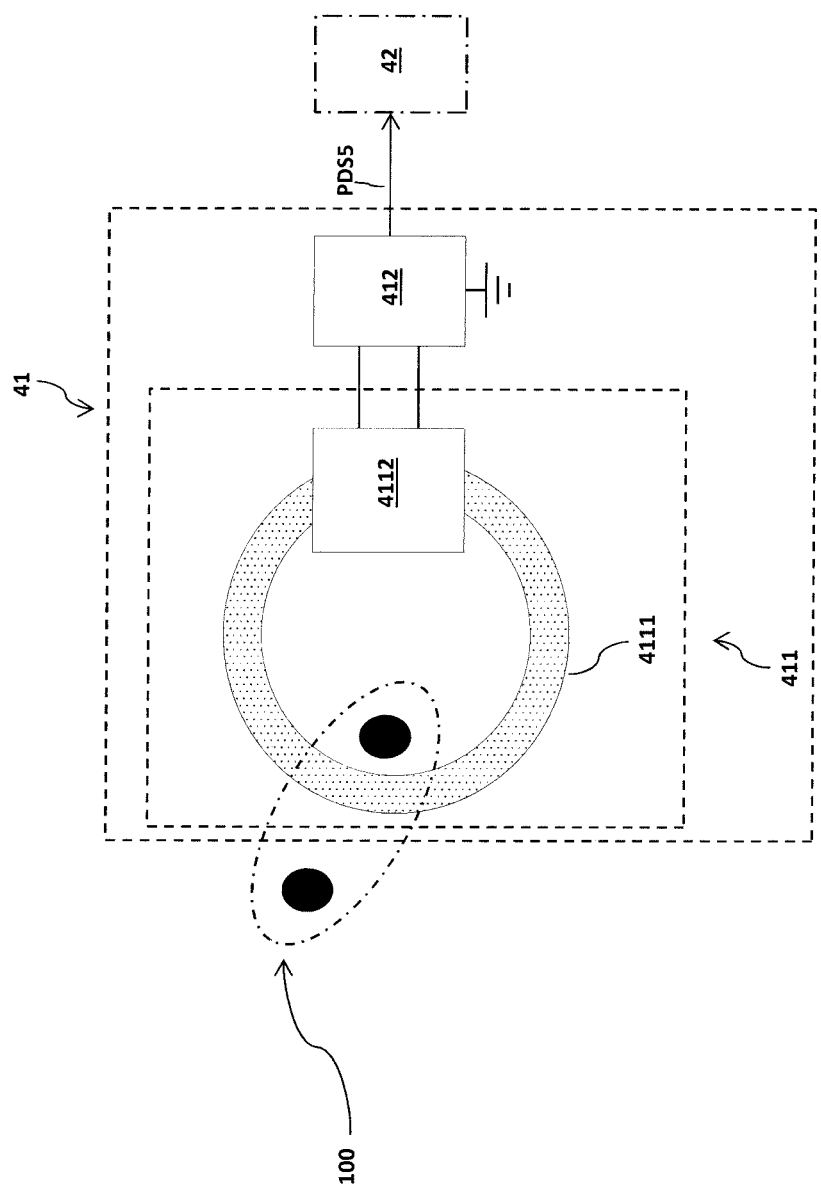
Figure 6:
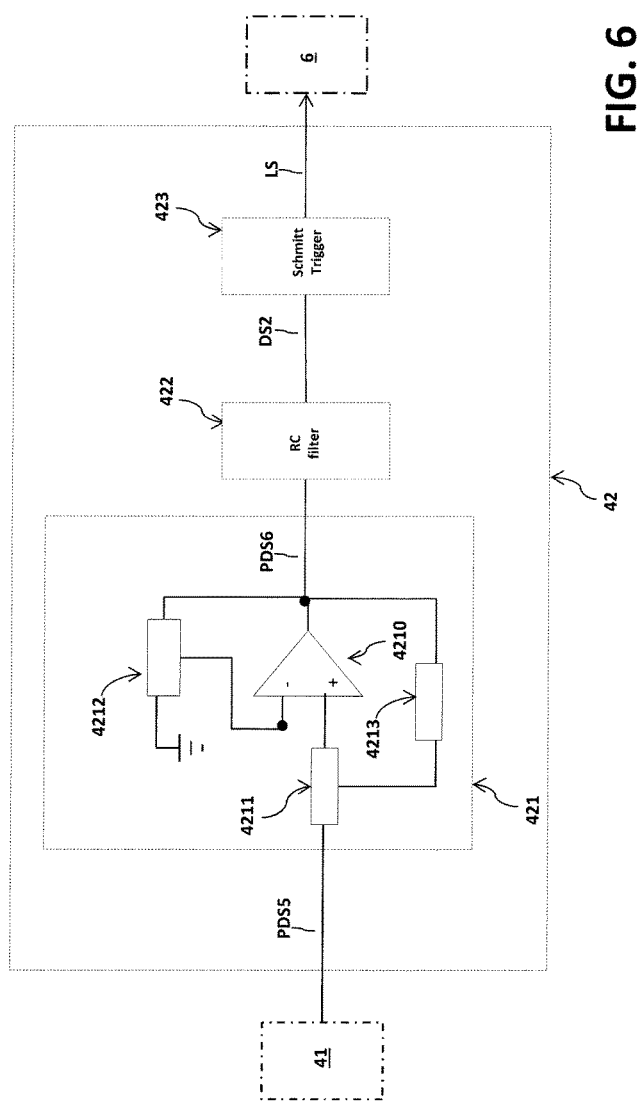
Figure 10:
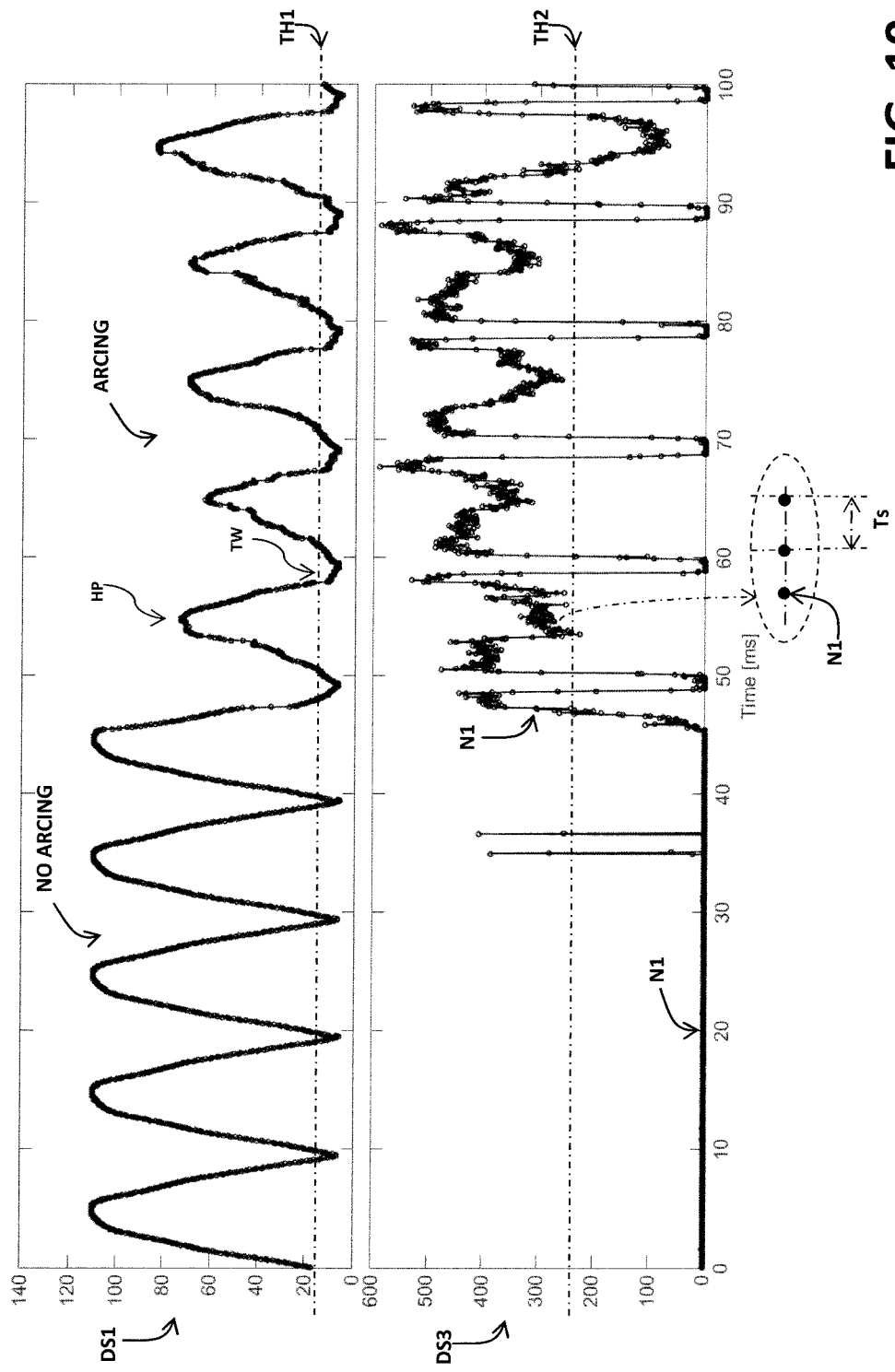
Figure 11:
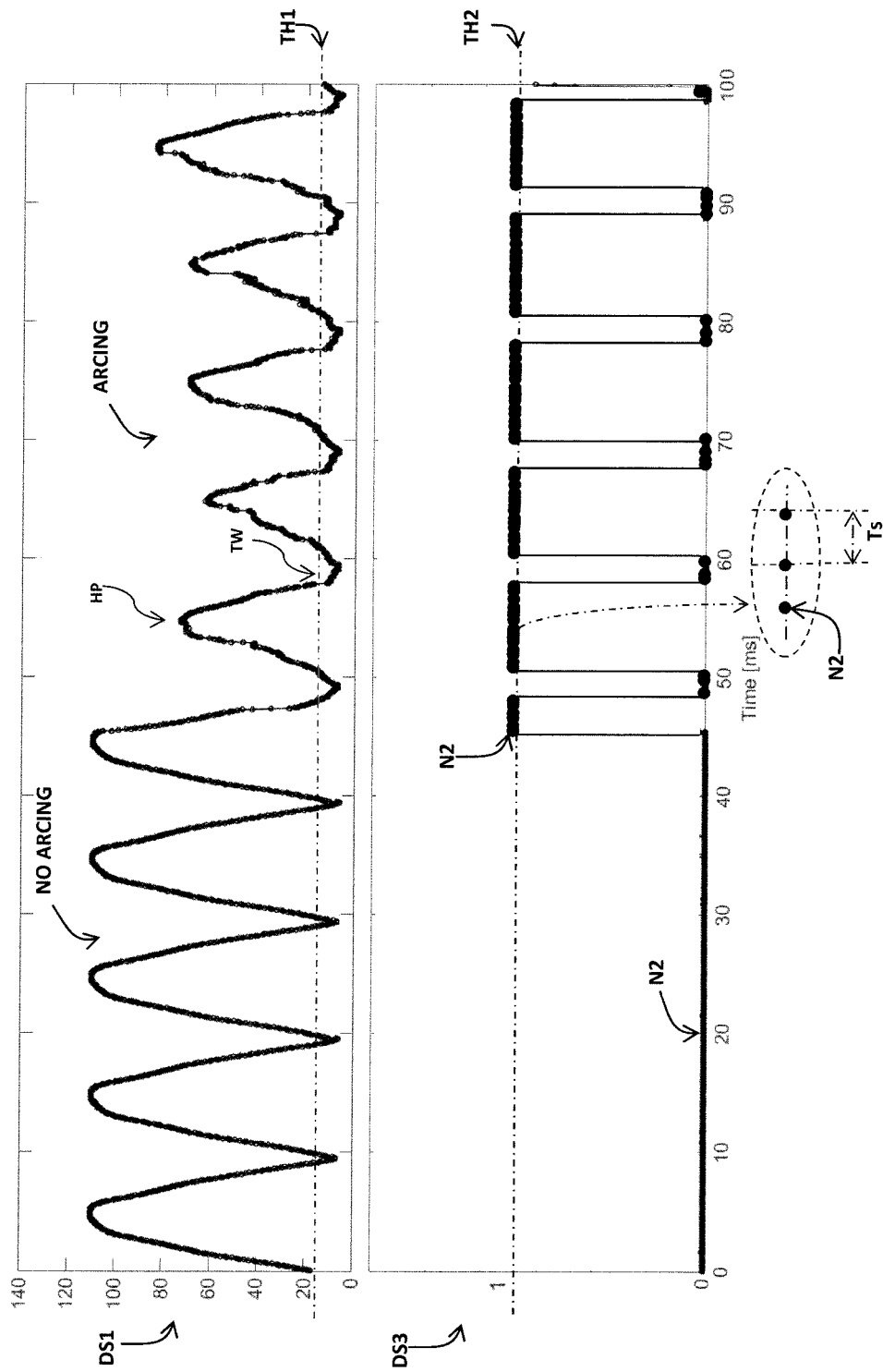
Figure 12:
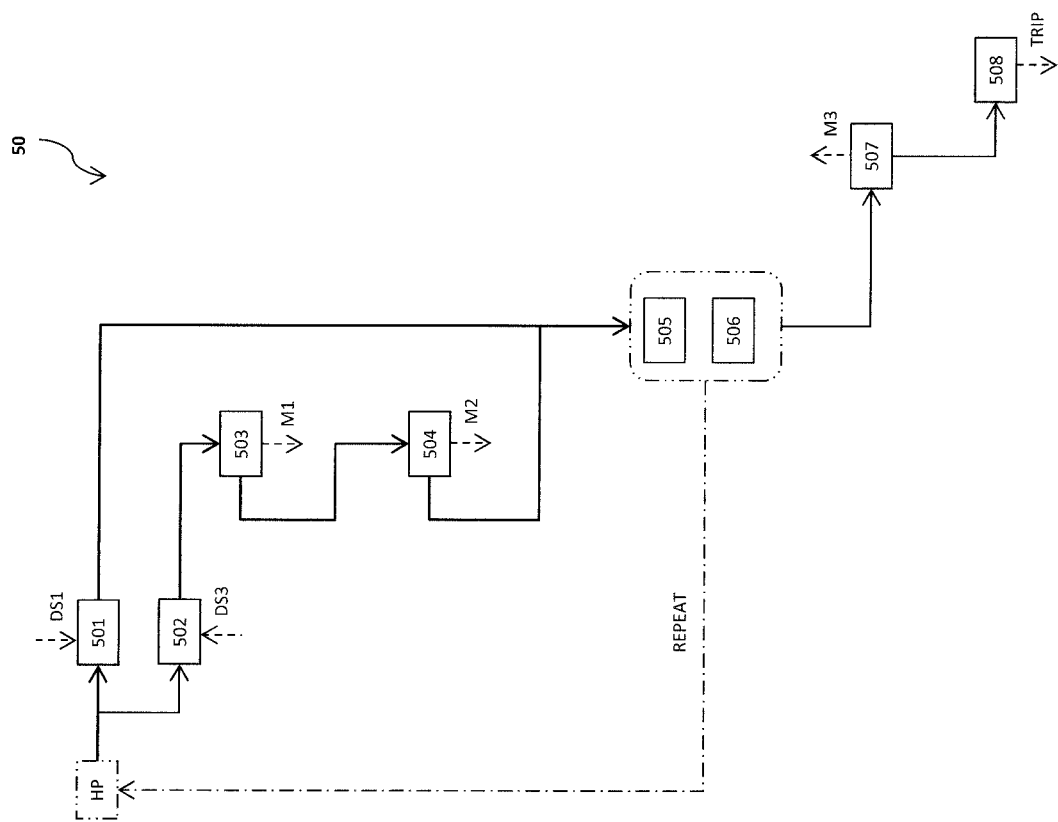

Further characteristics and advantages of the invention will become apparent from the detailed description of exemplary embodiments of the electronic protection device, which is illustrated only by way of non-limitative examples in the accompanying drawings, wherein:

FIG. 1 is a block diagram of a LV electric line to which an electronic protection device, according to the invention, is operatively associated;

FIG. 2 schematically shows an embodiment of the electronic protection device, according to the invention;

FIGS. 3-6, 9A-9C schematically show different components included in the electronic protection device, according to some embodiments of the invention;

FIGS. 7-8, 10-11 schematically show some detection signals provided in the electronic protection device, according to the invention; and FIG. 12 schematically shows the operation of a determination module of the control unit of the electronic protection device, according to an embodiment of the invention.

With reference to the cited figures, the present invention relates to an electronic protection device 1, which, in operation, is associated to a low-voltage electric line 100.

For the purposes of the present application, the term "low voltage" (LV) relates to operating voltages lower than 1 kV AC and 1.5 kV DC.

The electric line 100 comprises one or more phase conductors P and, preferably, a neutral conductor N.

Preferably, the electric line 100 comprises a single phase conductor P and a neutral conductor N.

In the following, the electronic protection device 1 will be described with reference to its installation in an electric line having a single phase conductor P and a neutral conductor N for the sake of simplicity only, without intending to limit the scope of the invention.

As the skilled person will certainly understand, the electric line 100 may, in fact, have different arrangements for its own conductors, according to the needs.

The electric line 100 is intended to electrically connect an electric power source SC and an electric load LD, which may be of any type.

In operation, the electronic protection device 1 allows or interrupts a current flow IL between the electric power source SC and the electric load LD, more precisely between upstream portions 100A and downstream portions 100B of the electric line 100, which are electrically connected with the electric power source SC and the electric load LD, respectively.

Conveniently, the electronic protection device 1 may be arranged according to different configurations.

According to some configurations (typically dedicated to the North American market), the electronic protection device 1 can take three different operative states, namely a closed state, a tripped state and an open state, during its operating life.

According to other configurations (typically dedicated to the European or other international markets), the electronic protection device 1 can take two different operative states, namely a closed state and an open state, during its operating life.

When it operates in a closed state, the electronic protection device 1 allows a current IL to flow along the electric line 100 between the upstream and downstream portions 100A, 100B of this latter.

When it operates in a tripped state or open state, the electronic protection device 1 interrupts the current IL along the electric line 100, thereby electrically disconnecting the upstream and downstream portions 100A, 100B of this latter.

Conveniently, the electronic protection device 1 comprises an outer casing (not shown), preferably made of electrically insulating material, which defines an internal volume to accommodate the components of said electronic protection device.

The electronic protection device 1 comprises one or more pairs of electric contacts 10, including a mobile contact and a fixed contact.

Each pair of electric contacts 10 is intended to be electrically connected to a corresponding conductor of the electric line 100 and, in operation, can be mutually coupled or separated.

When the electric contacts 10 are mutually coupled, the protection device 1 is in a closed state and an electric current IL can flow along the corresponding conductor of the electric line 100.

When the electric contacts 10 are decoupled, the protection device 1 is in a tripped state or open state and an electric current IL is prevented from flowing along the corresponding conductor of the electric line 100.

The electric contacts 10 and their electrical connection with the corresponding conductors of the electric line 100 may be realized in known manners that will not here described in more details for the sake of brevity.

Additionally, the skilled person will certainly understand that, in operation, the pairs of electric contacts 10 of the electronic protection device are all operated in a coordinated manner in a coupled state or in a decoupled state for obvious purposes of electrical continuity and current balancing.

The electric protection device 1 comprises an operating mechanism 11 operatively coupled with the electric contacts 10 (in particular with the mobile contacts thereof) and mechanically interacting with these latter.

The electric protection device 1 comprises a tripping unit 12 adapted to mechanically actuate the operating mechanism 11.

In operation, upon receiving a trip signal TS, the tripping unit 12 actuates the operating mechanism 11 to decouple the electric contacts 10, thereby carrying out a tripping manoeuver of the electronic protection device.

Preferably, the tripping unit 12 comprises an electromagnetic actuator.

Preferably, the tripping unit 12 is fed by the electric line 100 through a power supply unit (not shown) of the electronic protection device.

The electric protection device 1 conveniently comprises other mechanical components, e.g. a handle 13 operatively coupled with the operating mechanism 11 and mechanically interacting with this latter.

The handle 13 is movable (preferably around a suitable rotation axis) between two or three operating positions (depending on the configuration of the electronic protection device).

The handle 13 may be actuated by the operating mechanism 11, by a user or by external equipment during a tripping or opening maneuver of the electronic protection device.

The handle 13 may actuate the operating mechanism 11 in order to couple or decouple or maintain decoupled (depending on the configuration of the electronic protection device) the electric contacts 10 during an opening manoeuver or a closing maneuver of the electronic protection device.

In general, the operating mechanism 11, the tripping unit 12 and the handle 13 may be realized and operatively coupled in known manners that will not here described in more details for the sake of brevity.

The electronic protection device 1 comprises a control unit 2 for controlling the operation of said electronic protection device.

The control unit 2 comprises a controller 20, e.g. a microcontroller.

Preferably, the control unit 2 is fed by the electric line 100 through a power supply unit (not shown) of the electronic protection device.

The controller 20 conveniently include data processing resources of digital type, e.g. a CPU capable of executing stored software instructions, peripheral modules and I/O ports to carry out its functionalities, according to the needs.

An important function of the control unit 2 consists in providing a trip signal TS to activate the tripping unit 12 when fault conditions, which require a tripping manoeuvre of the electronic protection device, are present in the electric line 100.

Fault conditions may include ground fault conditions, arc fault conditions, over-current conditions, over-voltage conditions, internal fault conditions in the electronic protection device, and so on.

The control unit 2 may comprise suitable arrangements (not shown) to detect and determine the presence of ground fault conditions, over-current conditions, over-voltage conditions in the electric line 100 and/or of internal fault conditions in the electronic protection device. Such arrangements may be of known type and will not here further described for the sake of brevity.

As it will better be illustrated in the following, according to the invention, the control unit 2 is characterised by an innovative arrangement (references 3, 4, 5, 6, 7 of the cited figures) to detect and determine the presence of arc fault conditions in the electric line 100.

According to the invention, the control unit 2 comprises:
- a first detection module 3, which, in operation, detects the line current IL flowing along the electric line 100 and provides in output a first detection signal DS1. The first detection signal DS1 is indicative of the behavior (in amplitude) of low-frequency components of the line current IL;
- a second detection module 4, which, in operation, detects the line current IL and provides a second detection signal DS2 indicative of the behavior (in amplitude) of high-frequency components of the line current IL;
- a comparison module 5, which, in operation receives and processes the second detection signal DS2 and provides a logic signal LS variable in amplitude between two different logic levels LS1, LS2. The logic signal LS is subject to possible level transitions from a logic level to another depending on the behavior (in amplitude) of the second detection signal DS2;
- a third detection module 6, which, in operation receives and processes the logic signal LS and provides a third detection signal DS3 indicative of the presence of possible level transitions in the logic signal LS;
- a determination module 7, which, in operation receives and processes the first and third detection signals DS1, DS3 and determines the presence of arc fault conditions based on said detection signals. The determination module 7 provides a trip signal TS to the trip unit 12 to activate this latter, if arc fault conditions are determined.

The above-mentioned detection or signal processing modules 3, 4, 5, 6, 7 may be industrially implemented in an analog and/or digital manner.

If they are implemented in analog manner, they will comprise electronic circuits suitably arranged to perform their functionalities. Said electronic circuits may form separated circuit units or may be at least partially integrated in one or more circuit units.

If they are implemented in a digital manner, they will comprise suitable data processing resources capable of executing software instructions stored in a medium to perform their functionalities.

The present invention will be now described in more details with reference to embodiments, in which the detection module 3 is implemented by suitable electronic circuits and peripheral components of the microcontroller 20, the detection module 4 and the comparison module 5 are implemented by suitable electronic circuits, the detection module 6 is implemented by peripheral components and digital data processing resources of the microcontroller 20 and the determination module 7 is implemented by digital data processing resources of the microcontroller 20.

This choice is not intended to limit the scope of the invention in any way. Other embodiments, in which one or more of the above-mentioned detection and signal processing modules are differently implemented are possible and fall within the scope of the present invention.

In the framework of the present invention, the "low-frequency components" of the line current IL identify those current components having a frequency in a neighborhood of the line frequency (e.g. 50 Hz) of the electric line 100. As an example, the low-frequency components of the line current IL may have a frequency in a band of 5 Hz-5 kHz.

In the framework of the present invention, the "high-frequency components" of the line current IL identify those current components having a frequency very higher than the line frequency of the electric line 100 and very higher than the sampling frequencies (e.g. 20 kHz) adopted by the microcontroller 20 of the control unit 2. Conveniently, the high-frequency components of the line current IL have a frequency in the range of MHz (preferably higher than 1 MHz). As an example, these current components may have a frequency in a band of 10-12 MHz.

According to an embodiment of the invention (FIGS. 2-6), the first detection module 3 comprises a first current stage 31 and a first processing stage 32 electrically connected in cascade with said first current sensing stage.

Conveniently, the first current sensing stage 31 comprises a first current sensor 311 operatively coupled to a conductor L of the electric line 100 to detect the line current IL.

In operation, the first current sensing stage 31 provides in output a first preliminary detection signal PDS1 indicative of the behavior (in amplitude) of the line current IL whereas the first processing stage 32 receives and processes the first preliminary detection signal PDS1 and provides in output the first detection signal DS1 indicative of the behavior (in amplitude) of low-voltage components of the line current IL.

Figure 7:
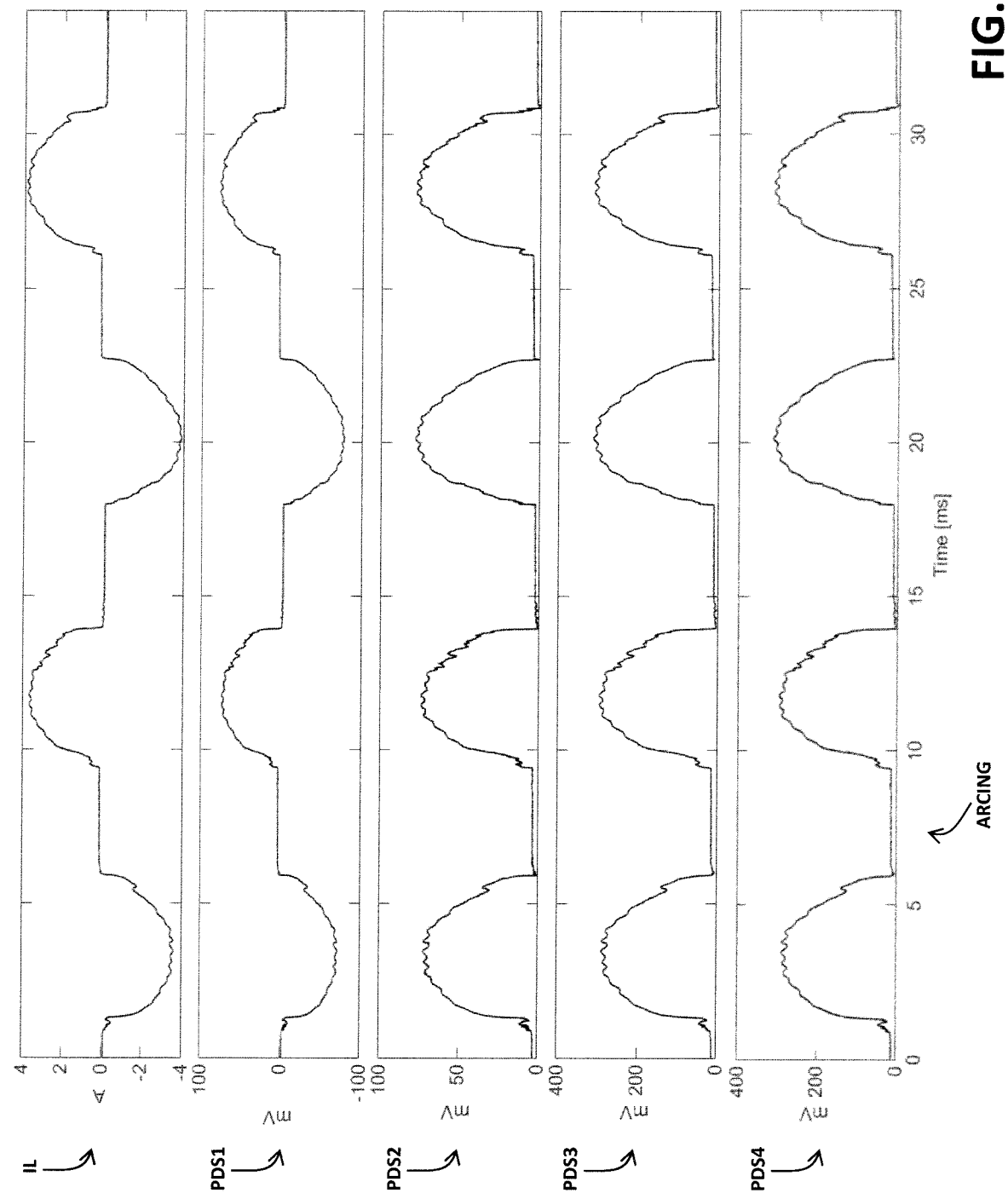

In FIG. 7, exemplary waveforms for the line current IL and the detection signal PDS1 are shown (arcing phenomena are present in the electric line 100). As illustrated, the detection signal PDS1 is preferably a voltage signal having a waveform substantially following the waveform of the detected line current IL.

In FIG. 10, exemplary waveforms of the detection signal DS1 are shown with reference to the cases in which no arcing phenomena are present and arcing phenomena are present in the electric line 100.

Preferably, the current sensor 311 comprises a current transformer provided with a magnetic core 3111 and a secondary winding 3112 advantageously wound around said magnetic core.

Preferably, the magnetic core 3111 is shaped as a toroid and is made of a high magnetic permeability material (e.g. cold-rolled grain oriented steel).

The transformer 311 is arranged in such a way that a conductor of the electric line 100 passes through the magnetic core 3111 so as to form the primary winding of said transformer.

Preferably, the first current sensing stage 31 comprises an output circuit section 312 electrically connected in cascade to the first current sensor 311 and configured to provide in output the first preliminary detection signal PDS1 (preferably a voltage signal) indicative of the behavior of the detected line current IL.

Preferably, the output circuit section 312 comprises a resistive circuit electrically connected to the secondary winding 3112 of the transformer 311, e.g. a shunt-resistor connected between a terminal of the secondary winding and the ground in such a way to receive a current circulating along the secondary winding 3112 and generate the voltage detection signal PDS1.

Preferably, the first processing stage 32 comprises a rectifier 321 electrically connected in cascade with the first current sensing stage 31.

In operation, the rectifier 321 receives and rectifies the first preliminary detection signal PDS1, which is provided in output by the first current sensing stage 31, and provides in output a second preliminary detection signal PDS2 indicative of the behavior (in amplitude) of the line current IL. In FIG. 7, exemplary waveforms of the detection signals PDS1, PDS2 are shown (arcing phenomena are present in the electric line 100).

As illustrated, the detection signal PDS2 is preferably a voltage signal having a waveform substantially corresponding to the rectified waveform of the detection signals PDS1.

Preferably, the rectifier 321 comprises an electronic circuit including an operational amplifier 3210 arranged in a known manner to provide above-described rectification functionalities. As an example, the operational amplifier 3210 may have the non-inverting input electrically connected to ground, the inverting input electrically connected to the output of the first current sensing stage 31 through a resistive network 3211 and the output electrically connected to the inverting input through a feedback network 3212 including one or more rectifying diodes.

Preferably, the first processing stage 32 comprises a first amplifier 322 electrically connected in cascade with the rectifier 321.

In operation, the first amplifier 322 receives and amplifies the second preliminary detection signal PDS2 and provides in output a third preliminary detection signal PDS3 indicative of the behavior of the line current IL.

In FIG. 7, exemplary waveforms of the detection signals PDS2, PDS3 are shown (arcing phenomena are present in the electric line 100).

As illustrated, the detection signal PDS3 is preferably a voltage signal having a waveform substantially corresponding to the waveform of the detection signals PDS2 but with an amplified amplitude.

Preferably, the amplifier 322 comprises an electronic circuit including an operational amplifier 3220 arranged in a known manner (e.g. in a non-inverting configuration) to provide above-described amplification functionalities. As an example, the operational amplifier 3220 may have the non-inverting input electrically connected to the output of the rectifier 321, the inverting input electrically connected to ground through a resistive network 3221 and the output electrically connected to the inverting input through a resistive network 3222.

Preferably, the first processing stage 32 comprises a first filter 323 electrically connected in cascade with the first amplifier 322.

In operation, the first filter 323 receives and performs a low-frequency band filtering of the third preliminary detection signal PDS3 and provides in output a fourth preliminary detection signal PDS4 indicative of the behavior of the low-frequency components of the line current IL.

In FIG. 7, exemplary waveforms of the detection signals PDS3, PDS4 are shown (arcing phenomena are present in the electric line 100). It will be noticed that the exemplary detection signal PDS4 shown in FIG. 7 has a base frequency of about twice the mains frequency (e.g. 60 Hz).

As illustrated, the detection signal PDS4 is preferably a voltage signal having a waveform quite similar to the waveform of the detection signal PDS3 as it includes the low-frequency components of this latter.

Preferably, the first filter 323 comprises an electronic circuit formed by a RC low-pass filter arranged in a known manner to provide the above-described filtering functionalities.

Preferably, the first processing stage 32 comprises a converter 324 electrically connected in cascade with the first filter 323.

In operation, the converter 324 receives and performs an A/D conversion of the fourth preliminary detection signal PDS4 and provides in output the first detection signal DS1 (FIG. 10). It will be noticed that the exemplary detection signal DS1 shown in FIG. 10 has a frequency of about 50 Hz whereas the sampling frequency adopted by the converter 324 is in the order of 20 KHz (sampling period Ts=50 µs).

Preferably, the converter 324 comprises a peripheral component (which may be of known type) of the microcontroller 20 as shown in FIG. 2. As an alternative, the converter 324 may comprise a stand-alone electronic device or circuit of known type operatively coupled to the first filter 323 and the controller 20.

According to an embodiment of the invention (FIGS. 2-6), the second detection module 4 comprises a second current stage 41 and a second processing stage 42 electrically connected in cascade with said second current sensing stage.

Conveniently, the second current sensing stage 41 comprises a second current sensor 411 (distinct from the first current sensor 311) operatively coupled to a conductor L of the electric line 100 to detect the line current IL.

In operation, the second current sensing stage 41 provides in output a fifth preliminary detection signal PDS5 indicative of the behavior (in amplitude) of the high-frequency components of the line current IL whereas the second processing stage 42 receives and processes the fifth preliminary detection signal PDS5 and provides in output the second detection signal DS2 indicative of the behavior of the high-frequency components of the line current IL.

Figure 8:
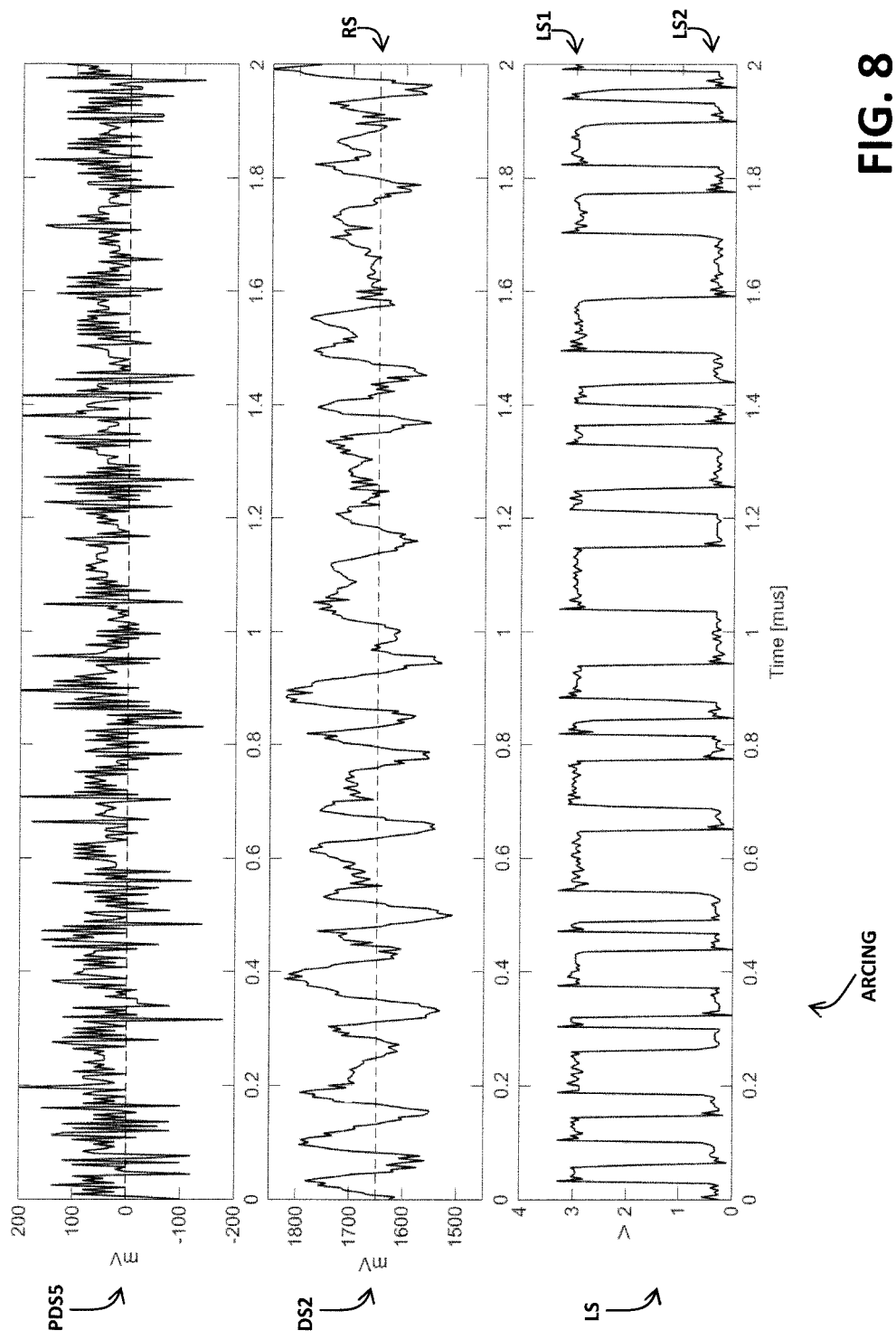

Exemplary waveforms of the detection signal PDS5 and of the detection signal DS2 are shown in FIG. 8 (presence of arcing phenomena in the electric line 100).

It will be noticed that these exemplary signals have a frequency in the order of 10 MHz. Preferably, the current sensor 411 comprises a current transformer provided with a magnetic core 4111 and a secondary winding 4112 advantageously wound around said magnetic core 411.

Preferably, the magnetic core 4111 is shaped as a toroid and is made of low magnetic permeability material suitable to work at high frequencies (e.g. ferrite or iron powder).

The transformer 411 is arranged in such a way that a conductor of the electric line 100 passes through the magnetic core 4111 so as to form the primary winding of said transformer.

Preferably, the second current sensing stage 41 comprises an output circuit section 412 electrically connected in cascade to the second current sensor 411 and configured to provide in output the fifth preliminary detection signal PDS5 (preferably a voltage signal) indicative of the behavior of the high-frequency components of the detected line current IL.

Preferably, the output circuit section 412 comprises passive analog circuitry connected to the secondary winding 4112 of the transformer 411 (e.g. a parallel of a resistor and a capacitor connected between a terminal of the secondary winding and the ground) in such a way to form a RLC circuit in cooperation with the secondary winding 4112 of the transformer (which provides a given inductance). Such a RLC circuit resonates at high-frequencies (e.g. 10 MHz) and provides in output the voltage detection signal PDS5.

Preferably, the second processing stage 42 comprises a second amplifier 421, electrically connected in cascade with the second current sensing stage 41, and a second filter 422, electrically connected in cascade with the second amplifier 421.

In operation, the second amplifier 421 receives and amplifies the fifth preliminary detection signal PDS5 and provides in output a detection signal PDS6 (not shown) indicative of the behavior of the high-frequency components of the line current IL. The second filter 422 receives the detection signal PDS6 and provides in output the detection signals DS2 (FIG. 8).

As illustrated, the detection signal DS2 is preferably a voltage signal having a waveform similar to the waveform of the preliminary detection signals PDS5 but with a cleaner behavior, an amplified amplitude and oscillating about a reference offset level RS.

Preferably, the amplifier 421 comprises an electronic circuit including an operation amplifier 4210 arranged in a known manner (e.g. in a Sallen-Key configuration).

As an example, the operational amplifier 4210 may have the non-inverting input electrically connected to an output of the current sensing stage 41 through a RC network 4211 and the output electrically connected to the inverting input through a RC network 4212 and to the non-inverting input through the resistive network 4213.

Preferably, the second filter 422 comprises an electronic circuit formed by a RC low-pass filter arranged in a known manner to filter very high-frequency components of the line current IL. As an example, said RC low-pass filter may have a cut-off frequency of about 28 MHz.

It is evident how the assembly formed by the above-mentioned RLC filter 412 and low-pass filter 422 substantially operates as a band-pass filter centered about a high-frequency band (e.g. 10-12 MHz).

According to an embodiment of the invention (FIGS. 2-6), the comparison module 5 compares the second detection signal DS2 with different first and second threshold levels that may be conveniently centered about the reference offset level RS (e.g. RS+ΔV, RS−ΔV, e.g. with a ΔV value about 10 mV).

Conveniently, in operation, the comparison module 5 provides in output:
- a logic signal LS at a conventionally "high" logic level LS1 (e.g. about 3V) as soon as the second detection signal DS2 crosses the first threshold level RS+ΔV and until the second detection signal DS2 crosses the second threshold level RS−ΔV;
- a logic signal LS at a conventionally "low" logic level LS2 (e.g. about 0.2 V) as soon as the second detection signal DS2 crosses the second threshold level RS−ΔV and until the second detection signal DS2 crosses the first threshold level RS+ΔV.

Preferably, the comparison module 5 comprises an electronic circuit including an operational amplifier arranged in a known manner (e.g. in a Schmitt Trigger configuration) to provide above-described comparison functionalities.

In FIG. 8, an exemplary waveform of the logic signal LS is shown (arcing phenomena are present in the electric line 100). It will be noticed that the exemplary logic signal LS has a frequency in the order of 10 MHz.

According to some embodiments of the invention (FIGS. 9A, 9B, 10), the third detection module 6 is adapted to provide a third detection signal DS3 formed by a sequence of count values N1.

The subsequent count values N1 are provided with a constant time frequency conveniently corresponding to the sampling frequency adopted by the controller 20.

In other words, two subsequent count values N1 are separated by a constant time interval Ts that conveniently corresponds to a sampling period (e.g. Ts=50 μs) adopted by the controller 20 (e.g. the same sampling period of the converter 324 described above).

Conveniently, each count value N1 is indicative of the number of level transitions of the logic signal LS in a corresponding time interval Ts.

As the number of level transitions of the logic signal LS depends of the behavior of the second detection signal DS2, as illustrated above, each count value N1 is in practice indicative of the number of oscillations of the second detection signal DS2, which have an amplitude sufficient to cross at least a threshold level RS+ΔV, RS−ΔV in a corresponding time interval Ts.

In FIG. 10, exemplary waveforms of the detection signal DS3 are shown with reference to the cases in which no arcing phenomena are present and arcing phenomena are present in the electric line 100. As it is evident, the third detection signal DS3 shows quite different behaviors when arcing phenomena are present or not.

According to an embodiment of the invention (FIG. 9A), the third detection module 6 comprises a first counter 61 adapted to detect and count the level transitions of the logic signal LS.

Preferably, the first counter 61 is formed by a peripheral component (which may be of known type) of the microcontroller 20 as shown in FIG. 2. As an alternative, the first counter 61 may comprise a stand-alone electronic device or circuit of known type operatively coupled to the comparison module 5 and the controller 20.

Preferably, the first counter 61 is a timer clocked by the logic signal LS.

According to the above-mentioned embodiment of the invention, the third detection module 6 comprises first data processing resources 62 interacting with the first counter 61.

Preferably, the data processing resources 62 are formed by a data processing component (which may be of known type) of the microcontroller 20, for example a CPU component capable of executing suitable stored software instructions to provide the functionalities described below.

In operation, the first counter 61 receives the logic signal LS and detects and counts the level transitions of said logic signal (e.g. only the transitions from the "low" logic level LS2 to the "high" logic level LS1).

The first counter 61 increases a count value saved in a first memory location MEM1 (e.g. comprised in said first counter) each time a level transition of the logic signal LS is detected.

At the end of each time interval Ts, the data processing resources 62 copy the count value N1 saved in the first memory location MEM1 into a second memory location MEM2 and reset the first memory location MEM1. The count value N1 saved in the second memory location MEM2 is made available in output by the data processing resources 62 during the following time interval Ts before being overwritten by a subsequent count value. In this way, the data processing resources 62 provide in output the third detection signal DS3 formed by a sequence of count values N1.

According to another embodiment of the invention (FIG. 9B), the third detection module 6 comprises a first interrupt generator 63 adapted to detect the level transitions of the logic signals LS and generate a first interrupt signal INT1 each time a level transition of the logic signal LS is detected.

Preferably, the interrupt generator 63 is formed by a peripheral component (which may be of known type) of the microcontroller 20 as shown in FIG. 2. As an alternative, the interrupt generator 63 may comprise a stand-alone electronic device or circuit of known type operatively coupled to the comparison module 5 and the controller 20.

Preferably, the interrupt generator 63 is a I/O port receiving the logic signal LS.

According to the above-mentioned embodiment of the invention, the third detection module 6 comprises second data processing resources 65 interacting with the interrupt generator 63.

Preferably, the data processing resources 65 are formed by a data processing component (which may be of known type) of the microcontroller 20, for example a CPU component capable of executing suitable stored software instructions to provide the functionalities described below.

In operation, the interrupt generator 63 receives the logic signal LS and detects the level transitions of the logic signal LS (e.g. only the transitions from the "low" logic level LS2 to the "high" logic level LS1).

The interrupt generator 63 generates an interrupt signal INT1 each time a level transition of the logic signal LS is detected.

The data processing resources 65 receive and count the interrupt signals INT1 generated by the interrupt generator 63 and increase a count value saved in a third memory location M3 each time an interrupt signal INT1 is received.

At the end of each time interval Ts, the data processing resources 65 copy the count value N1 saved in the third memory location MEM3 into a fourth memory location MEM4 and reset the third memory location MEM3. The count value N1 saved in the fourth memory location MEM4 is made available in output by the data processing resources 65 during the following time interval Ts before being overwritten by a subsequent count value. In this way, the data processing resources 62 provide in output the third detection signal DS3 formed by a sequence of count values N1.

According to some embodiments of the invention (FIGS. 9C, 11), the third detection module 6 is adapted to provide a third detection signal DS3 formed by a sequence of logic values N2.

The subsequent logic values N2 may conventionally take a "low" logic level (e.g. 0) or a "high" logic level (e.g. 1) and are provided with a constant time frequency conveniently corresponding to the sampling frequency adopted by the controller 20.

In other words, two subsequent logic values N2 are separated by a constant time interval Ts that conveniently corresponds to the sampling period adopted by the controller 20.

Conveniently, each logic value N2 is indicative of whether at least a level transition of the logic signal LS occurred in a corresponding time interval Ts. Each logic value N2 is in practice indicative of the fact that at least an oscillation of the second detection signal DS2, which has an amplitude sufficient to cross at least a threshold level RS+ΔV, RS−ΔV, occurred in a corresponding time interval Ts.

As an example, a logic value N2 at a "high" logic level may indicate that at least a level transition of the logic signal LS occurred in a corresponding time interval Ts whereas a logic value N2 at a "low" logic level may indicate that no level transitions of the logic signal LS occurred in the corresponding time interval Ts.

In FIG. 11, exemplary waveforms of the detection signal DS3 are shown with reference to the cases in which no arcing phenomena are present and arcing phenomena are present in the electric line 100. As it is evident, the third detection signal DS3 shows quite different behaviors when arcing phenomena are present or not present.

According to another embodiment of the invention (FIG. 9C), the third detection module 6 comprises a second interrupt generator 66 to detect the level transitions of the logic signal LS and generate a second interrupt signal INT2 in response to a detected level transition of the logic signal LS.

Preferably, the interrupt generator 66 is formed by a peripheral component (which may be of known type) of the microcontroller 20 as shown in FIG. 2. As an alternative, the interrupt generator 66 may comprise a stand-alone electronic device or circuit of known type operatively coupled to the comparison module 5 and the controller 20.

Preferably, the interrupt generator 66 is a I/O port receiving the logic signal LS.

According to the above-mentioned embodiment of the invention, the third detection module 6 comprises third data processing resources 67 interacting with the interrupt generator 66.

Preferably, the data processing resources 67 are formed by a data processing component (which may be of known type) of the microcontroller 20, for example a CPU component capable of executing suitable stored software instructions to provide the functionalities described below.

In operation, at the beginning of each time interval Ts, the data processing resources 67 send a start signal START to the interrupt generator 66 in such a way that said interrupt generator is enabled to detect the level transitions of the logic signal LS.

The interrupt generator 66 receives the logic signal LS, detects a level transition of the logic signal LS and generates an interrupt signal INT2 in response to the detected level transition.

As soon as it receives the interrupt signal INT2 from the interrupt generator 66, the data processing resources 67 send a stop signal STOP to the interrupt generator 63 in such a way that said interrupt generator is disabled and update a logic value saved in a fifth memory location MEM5.

At the end of each time interval Ts, the data processing resources 67 copy the logic value N2 saved in the fifth memory location MEM5 into a sixth memory location MEM6 and reset the fifth memory location MEM5 (e.g. to a "low" logic value). The logic value N2 saved in the sixth memory location MEM6 is made available in output by the data processing resources 67 during the following time interval Ts before being overwritten by a subsequent logic value. In this way, periodically interacting with the interrupt generator 66, the data processing resources 67 are capable of providing in output a third detection signal DS3 formed by a sequence of equally time-spaced logic values N2.

As each interrupt signal INT2 is generated when a level transition of the logic signal LS is detected by the interrupt generator 63, each logic value N2 is indicative of the occurrence of at least a level transition of the logic signal LS in a corresponding time interval Ts.

According to the above-described embodiments of the invention (FIGS. 9A, 9B, 9C, 10, 11), the determination module 7 is adapted to execute a determination procedure 50 (FIG. 12) to determine whether arc fault conditions are present in the electric line 100.

Conveniently, the determination procedure 50 comprises a sequence of steps 501-506 that is repeated for each half period HP of the first detection signal DS1.

Preferably, the determination procedure 50 comprises a step 501 of comparing the first detection signal DS1 with a first predefined threshold value TH1 that may be suitably set according to the needs.

Normally, such a comparison step allows to identify for each half period HP of the first detection signal DS1, two consecutive time windows in which the first detections signal DS1 is respectively higher and lower than the first predefined threshold value TH1.

Preferably, the determination procedure 50 comprises a step 502 of comparing the third detection signal DS3 with a second predefined threshold value TH2 that may be suitably set according to the needs.

Preferably, the determination procedure 50 comprises the step 503 of detecting, for the third detection signal DS3, a first number M1 of consecutive count values N1 or logic values N2, which are higher or equal than the second threshold value TH2, and the step 504 of detecting, for the third detection signal DS3, a second number M2 of consecutive count values N1 or logic values N2, which are lower than the second threshold value TH2.

Preferably, the determination procedure 50 comprises the step 505 of checking whether the following first condition is verified:
the first number M1 of consecutive count values N1 or logic values N2 is higher than a third threshold value TH3 that can be suitably set according to the needs.

Preferably, the determination procedure 50 comprises the step 506 of checking whether the following second condition is verified:
the second number M2 of consecutive count values N1 or logic values N2 is higher than a fourth threshold value TH4 that can be suitably set according to the needs; and
the second number M2 of consecutive count values N1 or logic values N2 is detected during a time window TW of the half-period HP, in which the first detection signal DS1 is lower than the first threshold value TH1.

If the above-mentioned first and second conditions are not simultaneously verified, the determination procedure 50 comprises the step of repeating the sequence of steps 501-506 described above for the following half-period. The on-going half-period is considered as a half-period in which no relevant arcing phenomena occur.

If the above-mentioned first and second conditions are simultaneously verified, the determination procedure 50 comprises the step of repeating the sequence of steps 501-506 described above for the following half-period. The on-going half-period is considered as a half-period in which relevant arcing phenomena occur.

In parallel to the execution of the steps 501-506 for each half-period HP, the determination procedure 50 comprises the step 507 of detecting a third number M3 of half-periods of the first detection signal DS1 for which the above-described first and second conditions occur.

If the detected third number M3 of half-periods is higher than a fifth threshold value TH5 that can be suitably set according to the needs, it means that arc fault conditions are determined.

In this case, the determination procedure 50 comprises the step 508 of providing in output a trip signal TS for the tripping unit 12 to activate this latter to interrupt the electric line 100.

Figure 9A:
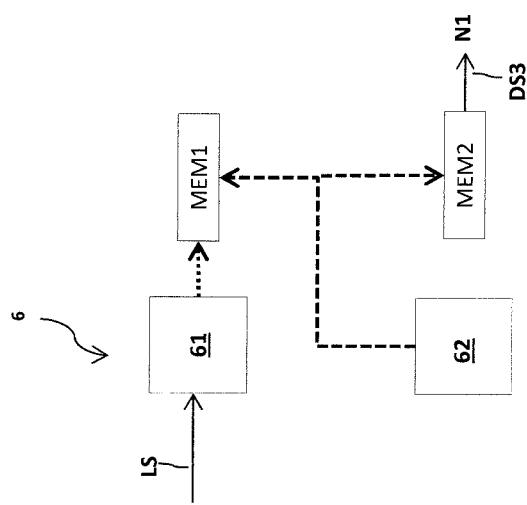
Figure 9B:
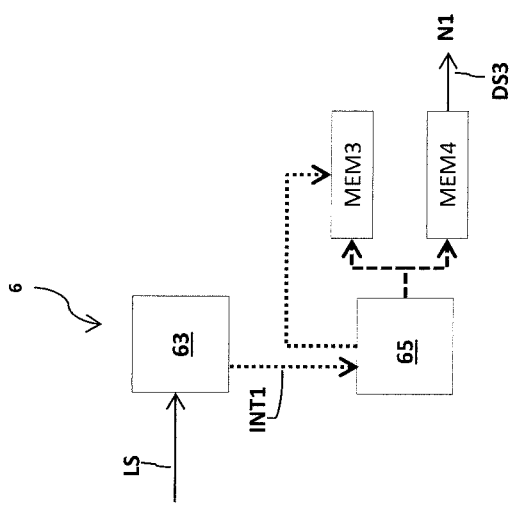
Figure 9C:
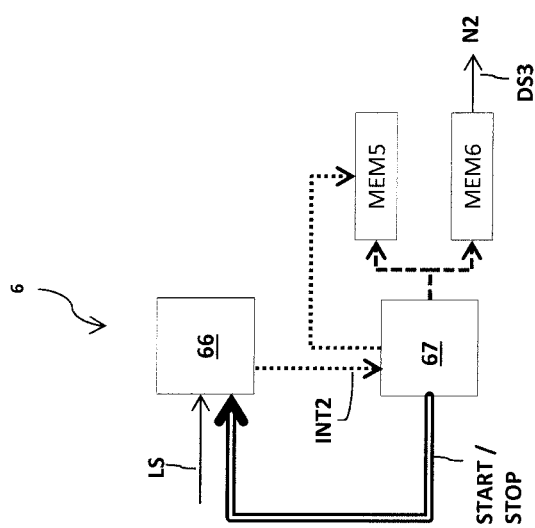

It is evident from FIGS. 10-11 that the above-described determination procedure 50 can be successfully implemented for all the above-described embodiments of FIGS. 9A-9C by suitably setting the threshold value TH2.

Additionally, referring again to FIGS. 10-11, it is obvious to notice how the above-described first and second conditions of the determination procedure 50 are verified if arcing conditions are present, thereby possibly leading to the determination of arc fault conditions.

The above mentioned determination procedure 50 allows checking whether high-frequency noise along the electric line is generated by arcing phenomena or by innocuous sources.

Preferably, the determination module 7 is formed by a data processing component (which may be of known type) of the microcontroller 20, for example a CPU component capable of executing suitable stored software instructions to provide the above-described functionalities.

In practice, it has been found that the electronic protection device, according to the invention, fully achieves the intended aim and objects.

The electronic protection device 1, according to the invention, provides reliable and efficient arc fault detection and determination functionalities.

At the same time, the electronic protection device 1 can be easily and cheaply produced at industrial level, e.g. as said arc fault detection and determination arrangement can be realized without expensive electronic components.

The electronic protection device 1 has a compact structure with a size similar to currently available electronic protection devices.

The electronic protection device 1 has proven to be easy to industrially manufacture, at competitive costs with respect to currently available electronic protection devices.

The invention claimed is:

1. An electronic protection device for a LV electric line including one or more conductors (P, N), comprising:
one or more pairs of electric contacts electrically connectable with corresponding conductors of said electric line and mutually coupleable or decoupleable;
a control unit adapted to control the operation of said electronic protection device, said control unit comprising: a first detection module adapted to detect a line current (IL) flowing along said electric line and provide a first detection signal (DS1) indicative of the behavior of low-frequency components of said line current;
a second detection module adapted to detect a line current (IL) flowing along said electric line and provide a second detection signal (DS2) indicative of the behavior of high-frequency components of said line current;
a comparison module adapted to process said second detection signal (DS2) and provide a logic signal (LS), the behavior of said logic signal depending on the behavior of said second detection signal;
a third detection module adapted to process said logic signal (LS) and provide a third detection signal (DS3) indicative of the presence of possible level transitions in said logic signal;
a determination module adapted to process said first and third detection signals (DS1, DS3) and determine the presence of arc fault conditions in said electric line, said determination module providing a trip signal (TS) if arc fault conditions are determined.
wherein said determination module is adapted to execute a determination procedure comprising the following steps:
for one or more half-periods (HP) of said first detection signal (DS1), executing the following steps:
comparing said first detection signal (DS1) with a first threshold value (TH1);
comparing said third detection signal (DS3) with a second threshold value (TH2);
detecting a number (M1, M2) of consecutive count values (N1) or logic values (N2) higher, equal or lower than said second threshold value (TH2) for said third detection signal (DS3);
checking whether a condition occurs, in which the number (M1, M2) of consecutive count values or logic values (N1, N2) higher than a third or fourth threshold value (TH3, TH4) is detected;

detecting a third number (M3) of half-periods (HP) of said first detection signal (DS1) for which said condition occurs;

providing in output said trip signal (TS) if said third number (M3) of half-periods (HP) is higher than a fifth threshold value (TH5).

2. The electronic protection device, according to claim 1, which further comprises a tripping unit and an operating mechanism, said tripping unit being adapted to actuate said operating mechanism in response to a trip signal (TS) received from said control unit, said operating mechanism being adapted to mechanically interact with said electric contacts to decouple said electric contacts when said operating mechanism is actuated by said tripping unit.

3. The electronic protection device, according to claim 2, wherein said first detection module comprises: a first current sensing stage comprising a first current sensor operatively coupled to a conductor of said electric line to detect said line current, said first current sensing stage being adapted to provide a first preliminary detection signal (PDS1) indicative of the behavior of said line current; and
a first processing stage electrically connected in cascade with said first current sensing stage and adapted to proves said first preliminary detection signal (PDS1) and provide said first detection signal (DS1).

4. The electronic protection device, according to claim 3, wherein said first processing stage comprises:
a rectifier electrically connected in cascade with said first current sensing stage, said rectifier being adapted to rectify said first preliminary detection signal (PDS1) and provide a second preliminary detection signal (PDS2) indicative of the behaviour of said line current;
a first amplifier electrically connected in cascade with said rectifier, said first amplifier being adapted to amplify said second preliminary detection signal (PDS2) and provide a third preliminary detection signal (PDS3) indicative of the behaviour of said line current;
a first filter electrically connected in cascade with said first amplifier, said first filter being adapted to filter said third preliminary detection signal (PDS3) and provide a fourth preliminary detection signal (PDS4) indicative of the behavior of low-frequency components of said line current;
a converter electrically connected in cascade with said first filter, said converter being adapted to perform an ND conversion of said fourth preliminary detection signal (PDS4) and provide said first detection signal (DS1).

5. The electronic protection device, according to claim 2, wherein said second detection module comprises:
a second current sensing stage comprising a second current sensor operatively coupled to a conductor of said electric line to detect said line current, said second current sensing stage being adapted to provide a fifth preliminary detection signal (PDS5) indicative of the behaviour of high-frequency components of said line current; and
a second processing stage electrically connected in cascade with said second current sensing stage and adapted to process said fifth preliminary detection signal (PDS5) and provide said second detection signal (DS2).

6. The electronic protection device, according to claim 5, wherein said second processing stage comprises:
a second amplifier electrically connected in cascade with said second current sensing stage, said second amplifier being adapted to amplify said fifth preliminary detection signal (PDS5) and provide a sixth preliminary detection signal (PDS6) indicative of the behavior of high-frequency components of said line current;
a second filter electrically connected in cascade with said second amplifier, said second filter being adapted to filter said sixth preliminary detection signal (PDS6) and provide said second detection signal (DS2).

7. The electronic protection device, according to claim 2, wherein said third detection module is adapted to provide a third detection signal (DS3) formed by a sequence of count values (N1) separated by a constant time intervals (Ts), each count value being indicative of a number of level transitions of said logic signal (LS) occurring within a corresponding time interval (Ts).

8. The electronic protection device, according to claim 7, wherein said third detection module comprises:
a counter adapted to detect and count the level transitions of said logic signal (LS);
first data processing resources adapted to acquire a count value (N1) indicative of the level transitions of said logic signal (LS) counted by said counter within said time interval (Ts) and provide in output said count value.

9. The electronic protection device, according to claim 1, wherein said first detection module comprises:
a first current sensing stage comprising a first current sensor operatively coupled to a conductor of said electric line to detect said line current, said first current sensing stage being adapted to provide a first preliminary detection signal (PDS1) indicative of the behavior of said line current;
a first processing stage electrically connected in cascade with said first current sensing stage and adapted to proves said first preliminary detection signal (PDS1) and provide said first detection signal (DS1).

10. The electronic protection device, according to claim 9, wherein said first processing stage comprises:
a rectifier electrically connected in cascade with said first current sensing stage, said rectifier being adapted to rectify said first preliminary detection signal (PDS1) and provide a second preliminary detection signal (PDS2) indicative of the behaviour of said line current;
a first amplifier electrically connected in cascade with said rectifier, said first amplifier being adapted to amplify said second preliminary detection signal (PDS2) and provide a third preliminary detection signal (PDS3) indicative of the behaviour of said line current;
a first filter electrically connected in cascade with said first amplifier, said first filter being adapted to filter said third preliminary detection signal (PDS3) and provide a fourth preliminary detection signal (PDS4) indicative of the behavior of low-frequency components of said line current;
a converter electrically connected in cascade with said first filter, said converter being adapted to perform an ND conversion of said fourth preliminary detection signal (PDS4) and provide said first detection signal (DS1).

11. The electronic protection device, according to claim 1, wherein said second detection module comprises:
a second current sensing stage comprising a second current sensor operatively coupled to a conductor of said electric line to detect said line current, said second current sensing stage being adapted to provide a fifth preliminary detection signal (PDS5) indicative of the behaviour of high-frequency components of said line current;

a second processing stage electrically connected in cascade with said second current sensing stage and adapted to process said fifth preliminary detection signal (PDS5) and provide said second detection signal (DS2).

12. The electronic protection device, according to claim 11, wherein said second processing stage comprises:
a second amplifier electrically connected in cascade with said second current sensing stage, said second amplifier being adapted to amplify said fifth preliminary detection signal (PDS5) and provide a sixth preliminary detection signal (PDS6) indicative of the behavior of high-frequency components of said line current;
a second filter electrically connected in cascade with said second amplifier, said second filter being adapted to filter said sixth preliminary detection signal (PDS6) and provide said second detection signal (DS2).

13. The electronic protection device, according to claim 1, wherein said third detection module is adapted to provide the third detection signal (DS3) formed by a sequence of count values (N1) separated by a constant time intervals (Ts), each count value being indicative of a number of level transitions of said logic signal (LS) occurring within a corresponding time interval (Ts).

14. The electronic protection device, according to claim 13, wherein said third detection module comprises:
a counter adapted to detect and count the level transitions of said logic signal (LS);
first data processing resources adapted to acquire a count value (N1) indicative of the level transitions of said logic signal (LS) counted by said counter within said time interval (Ts) and provide in output said count value.

15. The electronic device, according to claim 14, wherein said determination procedure further comprises the following steps:
for the one or more half-periods (HP) of said first detection signal (DS1), executing the following steps:
detecting a first number (M1) of consecutive count values (N1) or logic values (N2) higher or equal than said second threshold value (TH2) for said third detection signal (DS3);
detecting a second number (M2) of consecutive count values (N1) or logic values (N2) lower than said second threshold value (TH2) for said third detection signal (DS3);
checking whether a first condition occurs, in which a first number (M1) of consecutive count values or logic values (N1, N2) higher than a third threshold value (TH3) is detected;
checking whether a second condition occurs, in which a second number (M2) of consecutive count values or logic values (N1, N2) higher than a fourth threshold value (TH4) is detected during a time window (TW) of said half-period, in which said first detection signal (DS1) is lower than said first threshold value (TH1);
detecting the third number (M3) of half-periods (HP) of said first detection signal (DS1) for which said first and second conditions simultaneously occur.

16. The electronic protection device, according to claim 13, wherein said third detection module comprises:
a first interrupt generator adapted to detect the level transitions of said logic signal (LS) and provide a first interrupt signal (INT1) each time a level transition of said logic signal is detected;
second data processing resources adapted to count the first interrupt signals (INT1) provided by said first interrupt generator and provide in output a count value (N1) indicative of the first interrupt signals (INT1) counted within said time interval (Ts).

17. The electronic device, according to claim 13, wherein said determination procedure further comprises the following steps:
for the one or more half-periods (HP) of said first detection signal (DS1), executing the following steps:
detecting a first number (M1) of consecutive count values (N1) or logic values (N2) higher or equal than said second threshold value (TH2) for said third detection signal (DS3);
detecting a second number (M2) of consecutive count values (N1) or logic values (N2) lower than said second threshold value (TH2) for said third detection signal (DS3);
checking whether a first condition occurs, in which a first number (M1) of consecutive count values or logic values (N1, N2) higher than a third threshold value (TH3) is detected;
checking whether a second condition occurs, in which a second number (M2) of consecutive count values or logic values (N1, N2) higher than a fourth threshold value (TH4) is detected during a time window (TW) of said half-period, in which said first detection signal (DS1) is lower than said first threshold value (TH1);
detecting the third number (M3) of half-periods (HP) of said first detection signal (DS1) for which said first and second conditions simultaneously occur.

18. The electronic protection device, according to claim 13, wherein said third detection module comprises:
a first interrupt generator adapted to detect the level transitions of said logic signal (LS) and provide a first interrupt signal (INT1) each time a level transition of said logic signal is detected;
second data processing resources adapted to count the first interrupt signals (INT1) provided by said first interrupt generator and provide in output a count value (N1) indicative of the first interrupt signals (INT1) counted within said time interval (Ts).

19. The electronic protection device, according to claim 1, wherein said third detection module is adapted to provide the third detection signal (DS3) formed by a sequence of logic values (N2) separated by constant time intervals (Ts), each logic value being indicative of the presence of at least a level transition in said logic signal (LS) within a corresponding time interval (Ts).

20. The electronic protection device, according to claim 19, wherein said third detection module comprises:
a second interrupt generator adapted to detect the level transitions of said logic signal (LS) and provide a second interrupt signal (INT2) if a level transition of said logic signal is detected;
third data processing resources adapted to enable said second interrupt generator at the beginning of said time interval (Ts) and disable said second interrupt generator if said second interrupt signal INT2) is received from said second interrupt generator, said third data processing resources being adapted to provide a logic value (N2) indicative of the receipt of said second interrupt signal within said time interval (Ts).

* * * * *